United States Patent
Chong

(10) Patent No.: US 6,554,969 B1
(45) Date of Patent: Apr. 29, 2003

(54) ACOUSTICALLY ENHANCED DEPOSITION PROCESSES, AND SYSTEMS FOR PERFORMING SAME

(75) Inventor: Robert James Chong, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 28 days.

(21) Appl. No.: 09/903,258

(22) Filed: Jul. 11, 2001

(51) Int. Cl.$^7$ .................. C23C 14/34; C23C 16/00; H05H 1/02; B06B 1/00; B05C 11/00

(52) U.S. Cl. .................. 204/192.12; 204/298.02; 204/298.06; 427/600; 427/570; 427/576; 118/600; 118/722

(58) Field of Search .................. 204/192.12, 192.15, 204/298.02, 298.06, 298.13; 427/595, 600, 523, 527, 531, 570, 576; 118/722, 600, 612

(56) References Cited

U.S. PATENT DOCUMENTS

| | | | |
|---|---|---|---|
| 5,858,475 A | * 1/1999 | Chiu | 427/560 |
| 6,057,223 A | * 5/2000 | Lanford et al. | 438/618 |
| 6,200,433 B1 | 3/2001 | Ding et al. | 204/192.15 |
| 6,235,163 B1 | 5/2001 | Angelo et al. | 204/192.12 |
| 6,238,533 B1 | 5/2001 | Satitpunwaycha | 204/298.25 |

OTHER PUBLICATIONS

Merriam–Webster's Collegiate Dictionary, 10$^{th}$ Edition, pp. 1174; 1183, & 1281.*

* cited by examiner

Primary Examiner—Steven H. VerSteeg
(74) Attorney, Agent, or Firm—Williams, Morgan & Amerson

(57) ABSTRACT

In general, the present invention is directed to acoustically enhanced deposition processes, and a system for performing same. In one embodiment, the method comprises providing a substrate having a layer of insulating material formed thereabove, the layer of insulating material having a plurality of openings formed therein, performing a deposition process to form a layer of metal at least in the openings in the layer of insulating material, and actuating at least one acoustic generator to generate sound waves during the deposition process. In one illustrative embodiment, the system comprises a deposition tool for receiving a substrate having a layer of insulating material formed thereabove, the layer of insulating material having a plurality of openings formed therein, and performing a deposition process to form a layer of metal at least in the openings in the layer of insulating material, and at least one acoustic generator coupled to the deposition tool to generate sound waves during the deposition process.

43 Claims, 1 Drawing Sheet

ACOUSTICALLY ENHANCED DEPOSITION PROCESSES, AND SYSTEMS FOR PERFORMING SAME

BACKGROUND OF THE INVENTION

1. Field of the Invention

The present invention is generally directed to the field of semiconductor manufacturing, and, more particularly, to acoustically enhanced deposition processes, and systems for performing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

In modern integrated circuit devices, millions of transistors are formed above a surface of a semiconducting substrate. To perform their intended functions, these transistors, or groups of transistors, are electrically coupled together by many levels of conductive inter-connections, i.e., conductive metal lines and plugs. These conductive lines and plugs allow electrical signals to propagate throughout the integrated circuit device. In general, these conductive interconnections are formed in layers of insulating material, e.g., silicon dioxide, HSQ, or other materials that may have a dielectric constant less than approximately 5.0. The insulating materials electrically isolate the various conductive interconnections and tend to reduce capacitive coupling between adjacent metal lines when the integrated circuit device is in operation. As the demand for high performance integrated circuit devices continues to increase, circuit designers and manufacturers look for ways to improve device performance. Recently, copper has become the material of choice for conductive interconnections for high performance integrated circuit devices, e.g., microprocessors, due to its lower resistance as compared to, for example, aluminum.

Conductive interconnections comprised of copper may be formed using a variety of process flows, e.g., single damascene, dual damascene, etc. For example, a layer of insulating material may be formed on or above a semiconducting substrate. Thereafter, a plurality of openings may be formed in the layer of insulating material using known photolithographic and etching techniques. Then, a relatively thin barrier metal layer comprised of, for example, tantalum, is conformally deposited above the insulating layer and in the openings in the insulating layer. Next, a relatively thin layer of copper, a so-called copper seed layer, is deposited on the barrier metal layer. A much thicker layer of copper is then formed by using known electroplating techniques. This final layer of copper will fill the remaining portions of the openings in the insulating layer, and have an upper surface that extends above the surface of the insulating layer. Ultimately, one or more chemical mechanical polishing (CMP) operations will be performed to remove the excess copper and barrier layer material from above the surface of the insulating layer. This process results in the definition of a plurality of conductive interconnections, e.g., conductive lines or plugs, or a combination of both, positioned within the openings in the insulating layer.

In the fabrication of semiconductors and other electronic devices, the directionality of the particles being deposited, e.g., metal particles, is important in filling small openings. As circuit densities increase, the widths of vias, contacts and other features have decreased to 0.25 $\mu$m or less, whereas the thicknesses of the dielectric layers remain substantially constant. Thus, the aspect ratios for the openings or features, i.e., the ratio of the depth to the minimum lateral dimension, increases, thereby pushing the aspect ratios of the contacts and vias to 4:1 and above. As the dimensions of the openings decrease, it becomes even more important to get directionality of the deposited particles in order to achieve conformal coverage on the sidewalls and bottom of the opening.

Conventional physical vapor deposition (PVD) processes are not well suited for directional deposition and, therefore, have difficulty penetrating and conformally lining the sidewalls and bottoms of openings where the aspect ratio exceeds 4:1. Thus, the uniformity and step coverage of the deposited layer will depend directly upon the structure architecture with the layer becoming thinner on the structure bottom and sidewall near the bottom. The uniformity and step coverage of the layer, and therefore the integrity of the layer, may be compromised by overhangs, voids and other undesirable formations in the device features.

To deposit material in high aspect ratio openings, methods such as a medium/high pressure physical vapor deposition (PVD) process, an ionized metal plasma (IMP) process, or a high density plasma physical vapor deposition (HDP-PVD), may be employed. The plasma density in IMP processes are typically between about $10^{11}$ cm$^{-3}$ and $10^{12}$ cm$^{-3}$. Generally, IMP processing offers the benefit of highly directional deposition with good bottom coverage in high aspect ratio openings. Initially, a plasma is generated by introducing a gas, such as helium or argon, into the chamber and then biasing a target to produce an electric field in the chamber, thereby ionizing a portion of the gas. An energized coil positioned proximate the processing region of the chamber couples electromagnetic energy into the plasma to result in an inductively-coupled medium/high density plasma between the target and a susceptor on which a substrate is placed for processing. The ions and electrons in the plasma are accelerated toward the target by the bias applied to the target causing the sputtering of material from the target. Under the influence of the plasma, the sputtered metal flux is ionized. An electric field due to an applied or self-bias, develops in the boundary layer, or sheath, between the plasma and the substrate that accelerates the metal ions towards the substrate in a direction substantially parallel to the electric field and perpendicular to the substrate surface. The bias energy is preferably controlled by the application of power, such as RF, to the susceptor to attract the sputtered target ions in a highly directionalized manner to the surface of the substrate to fill the features formed on the substrate.

The high density plasma of conventional HDP-PVD is typically achieved by operating at pressures between about 5–100 mTorr. It is believed that such pressures ensure thermalization and ionization of the sputtered metal particles. Thermalization refers to the slowing of the metal particles passing through the plasma by collisions with the plasma ions and must be sufficiently high to allow time for the coil to ionize the metal particles. Should the metal particles travel from the target to the substrate too quickly, the metal particles may not be ionized resulting in poor deposition rates and uniformity. Some of the problems encountered in forming metal layers in integrated circuit devices, and illustrative processes for forming such layers, are set forth in U.S. Pat. Nos. 6,200,433 B1, 6,238,533 B1 and 6,236,163 B1, each of which are hereby incorporated by reference in their entirety. Problems, such as voids or overlays, still exist with respect to forming layers of material, e.g., a metal, in openings having high aspect ratios. This is particularly true with respect to the formation of barrier metal layers and copper seed layers in integrated circuit devices.

The present invention is directed to a method that may solve, or at least reduce, some or all of the aforementioned problems.

SUMMARY OF THE INVENTION

The present invention is directed to acoustically enhanced deposition processes, and systems for performing same. In one embodiment, the method comprises providing a substrate having a layer of insulating material formed thereabove, the layer of insulating material having a plurality of openings formed therein, performing a deposition process to form a layer of metal at least in the openings in the layer of insulating material, and actuating at least one acoustic generator to generate sound waves during the deposition process.

In one illustrative embodiment, the system comprises a deposition tool for receiving a substrate having a layer of insulating material formed thereabove, the layer of insulating material having a plurality of openings formed therein, and performing a deposition process to form a layer of metal at least in the openings in the layer of insulating material, and at least one acoustic generator coupled to the deposition tool to generate sound waves during the deposition process.

In another illustrative embodiment, the system comprises a means for receiving a substrate having a layer of insulating material formed thereabove, the layer of insulating material having a plurality of openings formed therein, means for performing a deposition process to form a layer of metal at least in the openings in the layer of insulating material, and at least one means for generating sound waves during the deposition process, said means for generating sound waves being coupled to the means for performing the deposition process to form the layer of metal.

BRIEF DESCRIPTION OF THE DRAWINGS

The invention may be understood by reference to the following description taken in conjunction with the accompanying drawings, in which like reference numerals identify like elements, and in which.

Figure 1:
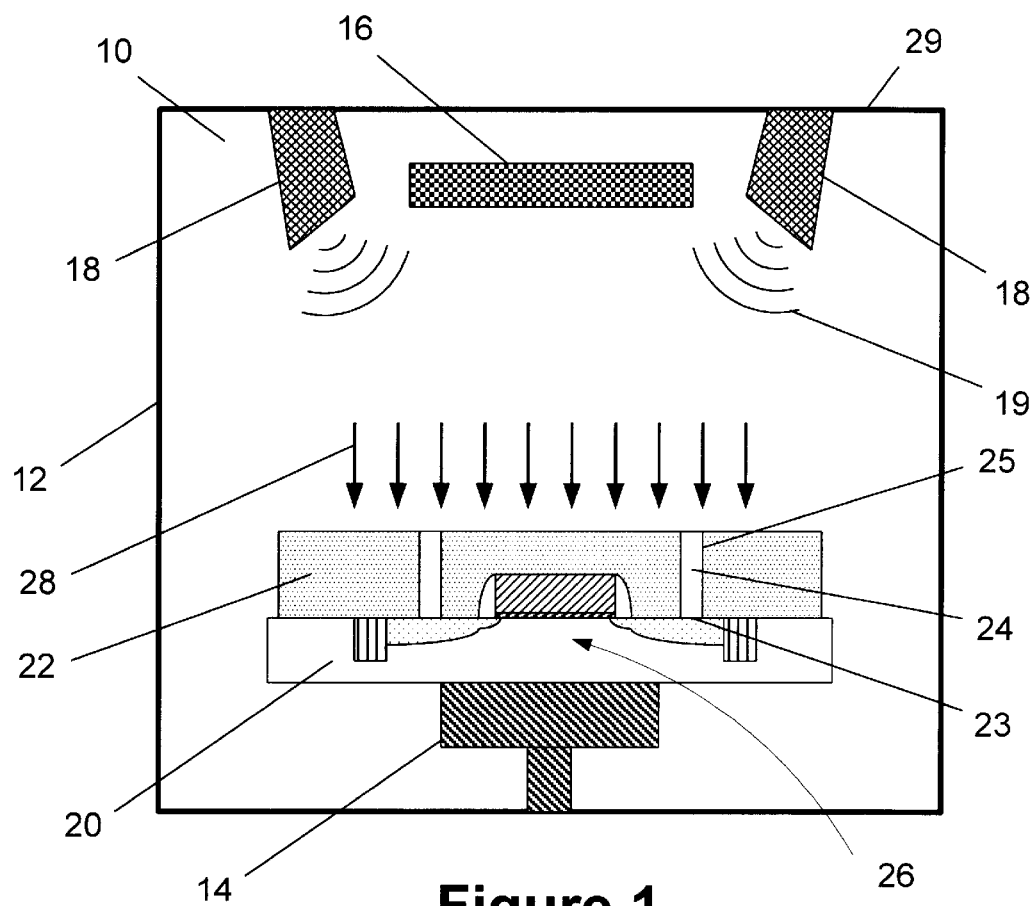
FIG. 1 is schematic diagram depicting one illustrative embodiment of a deposition tool in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. The various systems and equipment are depicted schematically in the drawings. However, those skilled in the art will recognize that, in reality, these systems and equipment may contain additional support facilities and components, e.g., motors, robotic arms, etc. Nevertheless, the attached drawings are included to describe and explain illustrative examples of the present invention.

In general, the present invention is directed to acoustically enhanced deposition processes, and systems for performing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

As set forth in the background section of the application, forming relatively thin metal layers, e.g., barrier metal layers, copper seed layers, etc., is difficult in openings having high aspect ratios, i.e., greater than 4:1. Moreover, as device sizes decrease and packing densities increase, the aspect ratio of such openings tends to increase, thereby increasing the problem. For example, in modern integrated circuit devices, the aspect ratio may range from approximately 4:1–5:1, with larger aspect ratios anticipated in the future. As the aspect ratio of the features increases, it becomes more difficult to form, for example, a barrier metal layer in an opening in an insulating layer where the feature will ultimately be formed.

In general, the present invention is directed to methods that may solve or at least reduce some of the problems encountered in forming layers of metal in such openings. After a complete reading of the present application, those skilled in the art will recognize that the present invention may be used in forming metal layers comprised of a variety of materials, e.g., titanium, tantalum, titanium nitride, tungsten, gold, copper, etc., or various combinations of such materials, e.g., a bilayer barrier metal scheme. Moreover, the present invention may be used with a variety of tools and systems capable of forming such layers, i.e., physical vapor deposition (PVD) systems, ionized metal plasma (IMP) deposition processes, high density plasma physical vapor deposition (HDP-PVD) systems, etc. Thus, the present invention should not be considered as limited to any particular type of deposition system or metal layer material, unless such limitations are clearly set forth in the appended claims.

FIG. 1 schematically depicts an illustrative deposition tool 10 that may be used in forming metal layers on integrated circuit devices, e.g., a barrier metal layer, a copper seed layer, etc. The processing tool 10 is comprised of, among other things, a chamber 12, a substrate stage 14, a target 16 and a plurality of acoustic generators 18. Those skilled in the art will appreciate that many components of the deposition tool 10 are not depicted in FIG. 1, e.g., a coil, various power sources, gas inlets and outlets, etc. The issued patents incorporated by reference earlier in this application provide a more detailed description of some of these components in some illustrative deposition systems. However, those components are not depicted in the present application for purposes of clarity.

Also depicted in FIG. 1 is a substrate 20 having a transistor 26 formed thereon, and a layer of insulating material 22 having a plurality of openings 24 formed therein. The insulating layer 22 may be comprised of a variety of materials, e.g., silicon dioxide, silicon oxynitride, or a material having a dielectric constant of 5.0 or less. The openings 24 may be of any configuration or size, and the aspect ratio of the openings 24 may vary greatly. Moreover, the openings 24 may be adapted to have a conductive interconnection, i.e., a conductive line, plug or via, formed therein. Also note that, although FIG. 1 depicts the situation where a conductive contact (not shown) will be formed to contact the transistor 26, the present invention may be used in forming conductive interconnections, e.g., lines or plugs, at any level of an integrated circuit device.

As will be recognized by those skilled in the art after a complete reading of the present application, the deposition tool 10 will be used to form a layer of metal, e.g., a barrier metal layer, a copper seed layer, etc., above the insulating layer 22 and in the openings 24 as part of a process of forming a conductive contact in the opening 24. In general, schematically depicted metal ions 28 will be sputtered from the target 16 and deposited on the insulating layer 22 and in the openings 24 formed therein. The physical arrangement of the acoustic generators 18 with respect to the deposition tool 10 may vary. For example, the acoustic generators 18 may be positioned entirely within the chamber 12, or a portion of the acoustic generators 18 may be positioned outside of the chamber 12. That is, the structure of the acoustic generator 18 may be such that portions of it are positioned inside and outside of the chamber 12. In any event, the acoustic generators 18 will be coupled to the deposition tool 10 so that sound waves produced by the acoustic generator 18 will be directed toward the substrate.

Figure 2:
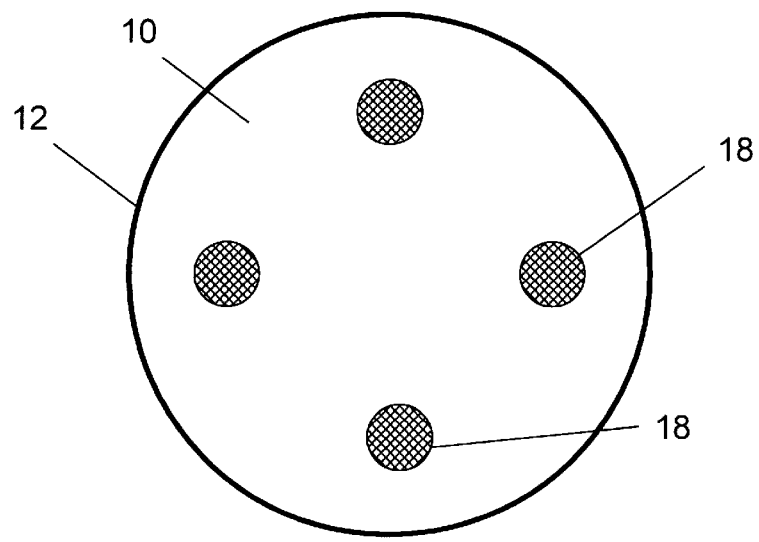
FIG. 2 is a plan view depicting an illustrative arrangement of a plurality of acoustic sources positioned within the deposition tool of FIG. 1.

The acoustic generators 18 will be used to generate sound waves 19 at some point during the deposition process performed by the deposition tool 10. A plurality of acoustic generators 18 may be employed in such a system. For example, as depicted in FIG. 2, four acoustic generators 18 are positioned adjacent the top surface 29 of the chamber 12. Alternatively, the acoustic generators 18 may be equally spaced around the sidewall of the chamber 12. Additional or fewer acoustic generators 18 may be employed if desired or warranted by the particular application. For example, three, six or eight acoustic generators 18 may be used. Moreover, the vertical positioning of the acoustic generators 18 relative to the substrate 22 may be varied.

In operation, the acoustic generators 18 will be used to generate sound waves during the process of forming a metal layer, e.g., a barrier metal layer, in the openings 24 in the insulating layer 22. More particularly, the acoustic generators 18 may be used to generate sound waves, either constantly or intermittently, during the deposition process. The sound waves 19 so generated may be directed toward the substrate at a variety of different angles as warranted by the particular application. Moreover, to obtain the desired wave pattern, the phase, amplitude and/or frequency of the sound waves may be varied during the course of a process. Additionally, the type of wave employed, e.g., square, triangular, etc., may be varied. The purpose of the sound waves is to provide additional downward force or energy to the metal ions 28 so that, even in high aspect ratio openings, the ions 28 will adequately cover the bottom 23 and sidewalls 25 of the openings 24. The acoustic generators 18 may contain internal mechanisms known to those skilled in the art for directing the sound waves 19 to the desired area of the substrate. In general, the sound waves 19 may be manipulated so as to cause constructive interference at or near the surface of the dielectric layer 22. That is, the sound waves 19 are manipulated in such a manner that, in one embodiment, they join in phase with one another to cause additional downwardly-directed compression waves to push the metal ions 28 toward the insulating layer 22. In this manner, the density of the ions 28 will be locally increased and the coverage and quality of the metal deposited in the openings 25 in the insulating layer 22 may be improved.

For example, in one embodiment, as the deposition process begins, the frequency of the sound waves 19 generated by the acoustic generators 18 may be relatively high, i.e., on the order of gigahertz in an effort to insure proper coverage of the bottom 23 of the opening 24. Moreover, the sound waves 19 may be pulsed during this period or they may be constantly generated for some period of time. Thereafter, the energy level and/or frequency of the sound waves 19 may be reduced as the sidewalls 25 of the opening 24 are covered. A vast variety of combinations of frequencies and/or energy levels are possible with the present invention. Thus, the particular process parameters of the operation of the acoustic generators 18 should not be considered a limitation of the present invention unless such limitations are clearly set forth in the appended claims.

The sound waves 19 produced by the acoustic generators 18 may be used in combination with thermal/heat transport mechanisms to improve metal deposition in the openings 24. More particularly, the substrate 20 may be heated via a heating source (not shown) in the wafer stage or chuck 14. The heat added may be used to allow surface actuation and migration of "islands" of the material comprising the metal layer. These "islands" tend to act as a seed layer at the surface of the insulating layer 22. The sound waves 19 generated by the acoustic generators 18 may be manipulated to cause directional deposition of the metal ions 28 on the insulating layer 22 and in the openings 24 formed therein.

In general, the present invention is directed to acoustically enhanced deposition processes, and systems for performing same. In one embodiment, the method comprises providing a substrate 20 having a layer of insulating material 22 formed thereabove, the layer of insulating material having a plurality of openings 24 formed therein, performing a deposition process to form a layer of metal at least in the openings 24 in the layer of insulating material 22, and actuating at least one acoustic generator 18 to generate sound waves 19 during the deposition process.

In one illustrative embodiment, the system comprises a deposition tool 10 for receiving a substrate 20 having a layer of insulating material 22 formed thereabove, the layer of insulating material 22 having a plurality of openings 24 formed therein, performing a deposition process to form a layer of metal at least in the openings 24 in the layer of insulating material 22, and at least one acoustic generator 18 positioned within the deposition tool 10 to generate sound waves 19 during the deposition process.

In another illustrative embodiment, the system comprises a means for receiving a substrate having a layer of insulating material formed thereabove, the layer of insulating material having a plurality of openings formed therein, means for performing a deposition process to form a layer of metal at least in the openings in the layer of insulating material, and at least one means for generating sound waves during the deposition process, the means for generating the sound waves being positioned, at least in part, within the means for performing a deposition process. In the disclosed embodiment, the means for receiving the substrate 20 is the wafer stage 14, and the means for performing a deposition process is the deposition tool 10, e.g., a PVD tool, an IMP-PVD tool, a HDP-PVD tool, etc. Moreover, in the disclosed embodiment, the means for generating sound waves are the acoustic generators 18.

Through use of the present invention, barrier metal layers and copper seed layers may be formed in openings with relatively high aspect ratios. Moreover, the additional directionality and energy provided by the sound waves 19 produced by the acoustic generators 18 may be useful in reducing some of the problems discussed in the background section of this application, e.g., void formation. As a result, conductive interconnections may be formed more accurately and reliably in modern integrated circuit devices, thereby increasing performance and reliability and reducing manufacturing errors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a substrate having a layer of insulating material formed thereabove, said layer of insulating material having a plurality of openings formed therein;
   performing a deposition process to form a layer of metal at least in said openings in said layer of insulating material; and
   actuating at least one acoustic generator to generate sound waves during said deposition process.

2. The method of claim 1, wherein providing a substrate comprises providing a substrate comprised of silicon.

3. The method of claim 1, wherein providing a substrate having a layer of insulating material formed thereabove, said layer of insulating material having a plurality of openings formed therein, comprises providing a substrate having a layer of insulating material comprised of a material having a dielectric constant less than 5.0 formed thereabove, said layer of insulating material having a plurality of openings formed therein.

4. The method of claim 1, wherein performing a deposition process to form a layer of metal at least in said openings comprises performing at least one of a physical vapor deposition process, an ionized metal physical vapor deposition process and a high density plasma physical vapor deposition process to form a layer of metal at least in said openings.

5. The method of claim 1, wherein performing a deposition process to form a layer of metal at least in said openings in said layer of insulating material comprises performing a deposition process to form a layer of metal comprised of at least one of copper, tantalum, gold, titanium, titanium nitride and tungsten at least in said openings in said layer of insulating material.

6. The method of claim 1, wherein actuating at least one acoustic generator to generate sound waves during said deposition process comprises actuating at least one acoustic generator to generate sound waves continuously during said deposition process.

7. The method of claim 1, wherein said openings have an aspect ratio of at least 4:1.

8. A method, comprising:
   providing a substrate having a layer of insulating material formed thereabove, said layer of insulating material having a plurality of openings formed therein;
   performing a deposition process to form a layer of metal at least in said openings in said layer of insulating material; and
   actuating at least one acoustic generator to generate supersonic sound waves during said deposition process.

9. A method, comprising:
   providing a substrate having a layer of insulating material formed thereabove, said layer of insulating material having a plurality of openings formed therein;
   performing a deposition process to form a layer of metal at least in said openings in said layer of insulating material; and
   actuating at least one acoustic generator to generate subsonic sound waves during said deposition process.

10. A method, comprising:
    providing a substrate having a layer of insulating material formed thereabove, said layer of insulating material having a plurality of openings formed therein;
    performing a deposition process to form a layer of metal at least in said openings in said layer of insulating material; and
    actuating at least one acoustic generator to generate sound waves intermittently during said deposition process.

11. A method, comprising:
    providing a substrate having a layer of insulating material formed thereabove, said layer of insulating material having a plurality of openings formed therein;
    performing a deposition process to form a layer of metal at least in said openings in said layer of insulating material;
    actuating at least one acoustic generator to generate sound waves during said deposition process; and
    varying a frequency of said sound waves.

12. A method, comprising:
    providing a substrate having a layer of insulating material formed thereabove, said layer of insulating material having a plurality of openings formed therein;
    performing a deposition process to form a layer of metal at least in said openings in said layer of insulating material;
    actuating at least one acoustic generator to generate sound waves during said deposition process; and
    varying an energy level of said sound waves.

13. A method, comprising:
    providing a substrate comprised of silicon having a layer of insulating material formed thereabove, said layer of insulating material being comprised of a material having a dielectric constant less than 5.0, said layer of insulating material having a plurality of openings formed therein;

positioning said substrate in a deposition chamber;

performing a deposition process in said deposition chamber to form a layer of metal at least in said openings in said layer of insulating material; and actuating at least one of a plurality of acoustic generators positioned within said chamber to generate sound waves during said deposition process and to direct said sound waves toward said substrate during said deposition process.

14. The method of claim 13, wherein performing a deposition process in said deposition chamber to form a layer of metal at least in said openings comprises performing at least one of a physical vapor deposition process, an ionized metal physical vapor deposition process and a high density plasma physical vapor deposition process in said deposition chamber to form a layer of metal at least in said openings.

15. The method of claim 13, wherein performing a deposition process in said deposition chamber to form a layer of metal at least in said openings in said layer of insulating material comprises performing a deposition process in said deposition chamber to form a layer of metal comprised of at least one of copper, tantalum, gold, titanium, titanium nitride and tungsten at least in said openings in said layer of insulating material.

16. The method of claim 13, wherein actuating at least one of a plurality of acoustic generators positioned within said chamber to generate sound waves during said deposition process and to direct said sound waves toward said substrate during said deposition process comprises actuating at least one of a plurality of acoustic generators positioned within said chamber to generate supersonic sound waves during said deposition process and to direct said sound waves toward said substrate during said deposition process.

17. The method of claim 13, wherein actuating at least one of a plurality of acoustic generators positioned within said chamber to generate sound waves during said deposition process and to direct said sound waves toward said substrate during said deposition process comprises actuating at least one of a plurality of acoustic generators positioned within said chamber to generate subsonic sound waves during said deposition process and to direct said sound waves toward said substrate during said deposition process.

18. The method of claim 13, wherein actuating at least one of a plurality of acoustic generators positioned within said chamber to generate sound waves during said deposition process and to direct said sound waves toward said substrate during said deposition process comprises actuating at least one of a plurality of acoustic generators positioned within said chamber to generate sound waves intermittently during said deposition process and to direct said sound waves toward said substrate during said deposition process.

19. The method of claim 13, wherein actuating at least one of a plurality of acoustic generators positioned within said chamber to generate sound waves during said deposition process and to direct said sound waves toward said substrate during said deposition process comprises actuating at least one of a plurality of acoustic generators positioned within said chamber to generate sound waves continuously during said deposition process and to direct said sound waves toward said substrate during said deposition process.

20. The method of claim 13, further comprising varying a frequency of said sound waves.

21. The method of claim 13, further comprising varying an energy level of said sound waves.

22. The method of claim 13, wherein said openings have an aspect ratio of at least 4:1.

23. A system, comprising:

a deposition tool for receiving a substrate having a layer of insulating material formed thereabove, said layer of insulating material having a plurality of openings formed therein, and performing a deposition process to form a layer of metal at least in said openings in said layer of insulating material; and at least one acoustic generator coupled to said deposition tool to generate sound waves during said deposition process.

24. The system of claim 23, wherein said deposition tool is comprised of at least one of a physical vapor deposition tool, an ionized metal physical vapor deposition tool and a high density plasma physical vapor deposition tool.

25. The system of claim 23, wherein said deposition tool is adapted to form a layer of metal comprised of at least one of copper, tantalum, gold, titanium, titanium nitride and tungsten at least in said openings in said layer of insulating material.

26. The system of claim 23, wherein said at least one acoustic generator is adapted to generate sound waves continuously during said deposition process.

27. A system, comprising:

a deposition tool for receiving a substrate having a layer of insulating material formed thereabove, said layer of insulating material having a plurality of openings formed therein, and performing a deposition process to form a layer of metal at least in said openings in said layer of insulating material; and at least one acoustic generator coupled to said deposition tool to generate supersonic sound waves during said deposition process.

28. A system, comprising:

a deposition tool for receiving a substrate having a layer of insulating material formed thereabove, said layer of insulating material having a plurality of openings formed therein, and performing a deposition process to form a layer of metal at least in said openings in said layer of insulating material; and at least one acoustic generator coupled to said deposition tool to generate subsonic sound waves during said deposition process.

29. A system, comprising:

a deposition tool for receiving a substrate having a layer of insulating material formed thereabove, said layer of insulating material having a plurality of openings formed therein, and performing a deposition process to form a layer of metal at least in said openings in said layer of insulating material; and at least one acoustic generator coupled to said deposition tool to generate sound waves intermittently during said deposition process.

30. A system, comprising:

a deposition tool for receiving a substrate having a layer of insulating material formed thereabove, said layer of insulating material having a plurality of openings formed therein, and performing a deposition process to form a layer of metal at least in said openings in said layer of insulating material; and at least one acoustic generator coupled to said deposition tool to generate sound waves during said deposition process, said at least one acoustic generator being adapted to vary a frequency of said sound waves.

31. A system, comprising:
a deposition tool for receiving a substrate having a layer of insulating material formed thereabove, said layer of insulating material having a plurality of openings formed therein, and performing a deposition process to form a layer of metal at least in said openings in said layer of insulating material; and
at least one acoustic generator coupled to said deposition tool to generate sound waves during said deposition process, said at least one acoustic generator being adapted to vary an energy level of said sound waves.

32. A system, comprising:
a deposition tool for receiving a substrate having a layer of insulating material formed thereabove, said layer of insulating material having a plurality of openings formed therein, and performing a deposition process to form a layer of metal at least in said openings in said layer of insulating material; and
a plurality of acoustic generators coupled to said deposition tool to generate sound waves during said deposition process.

33. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating sound waves during said deposition process, said means for generating sound waves being coupled to said means for performing said deposition process.

34. The system of claim 33, wherein said means for performing a deposition process is comprised of at least one of a physical vapor deposition tool, an ionized metal physical vapor deposition tool and a high density plasma physical vapor deposition tool.

35. The system of claim 33, wherein said means for performing a deposition process is adapted to form a layer of metal comprised of at least one of copper, tantalum, gold, titanium, titanium nitride and tungsten at least in said openings in said layer of insulating material.

36. The system of claim 33, wherein said at least one means for generating sound waves is adapted to generate sound waves continuously during said deposition process.

37. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating supersonic sound waves during said deposition process, said means for generating sound waves being coupled to said means for performing said deposition process.

38. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating subsonic sound waves during said deposition process, said means for generating sound waves being coupled to said means for performing said deposition process.

39. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating sound waves intermittently during said deposition process, said means for generating sound waves being coupled to said means for performing said deposition process.

40. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating sound waves during said deposition process, said means for generating sound waves being coupled to said means for performing said deposition process, said means for generating sound waves being adapted to vary a frequency of said sound waves.

41. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating sound waves during said deposition process, said means for generating sound waves being coupled to said means for performing said deposition process, said means for generating sound waves being adapted to vary an energy level of said sound waves.

42. A system, comprising:
means for receiving a substrate having a layer of insulating material formed thereabove, said layer of insulating material having a plurality of openings formed therein,
means for performing a deposition process to form a layer of metal at least in said openings in said layer of insulating material; and
at least one means for generating sound waves during said deposition process, said means for generating sound waves being coupled to said means for performing said deposition process, said at least one means for generating sound waves being comprised of a plurality of acoustic generators.

43. A method, comprising:
providing a substrate comprised of silicon having a layer of insulating material formed thereabove, said layer of insulating material having a plurality of openings formed therein;
positioning said substrate in a deposition chamber;
performing a deposition process in said deposition chamber to form a layer of metal at least in said openings in said layer of insulating material; and
actuating at least one of a plurality of acoustic generators positioned within said chamber to generate sound waves during said deposition process and to direct said sound waves toward said substrate during said deposition process.

* * * * *